US006772390B2

(12) United States Patent
Weng et al.

(10) Patent No.: US 6,772,390 B2
(45) Date of Patent: Aug. 3, 2004

(54) ERASURE CORRECTION FOR ECC ENTITIES

(75) Inventors: Lih-Jyh Weng, Shrewsbury, MA (US); Dana Hall, Hopkinton, MA (US)

(73) Assignee: Quantum Corporation, San Jose, CA (US)

( * ) Notice: Subject to any disclaimer, the term of this patent is extended or adjusted under 35 U.S.C. 154(b) by 462 days.

(21) Appl. No.: 09/727,838

(22) Filed: Nov. 30, 2000

(65) Prior Publication Data

US 2002/0095638 A1 Jul. 18, 2002

(51) Int. Cl.$^7$ ............................................... H03M 13/15
(52) U.S. Cl. ...................... 714/785; 714/762; 714/771; 714/784
(58) Field of Search ............................... 714/762, 771, 714/784–785

(56) References Cited

U.S. PATENT DOCUMENTS

| | | | |
|---|---|---|---|
| 4,665,537 A | * 5/1987 | Moriyama | .................. 714/784 |
| 4,856,003 A | 8/1989 | Weng | |
| 4,866,716 A | 9/1989 | Weng | |
| 4,975,867 A | 12/1990 | Weng | |
| 5,136,592 A | 8/1992 | Weng | |
| 5,315,601 A | 5/1994 | Lee et al. | |
| 5,359,610 A | 10/1994 | Weng | |
| 6,317,855 B1 | * 11/2001 | Horibe | ........................ 714/771 |
| 6,553,533 B2 | * 4/2003 | Demura et al. | ............. 714/784 |
| 6,553,538 B2 | * 4/2003 | Zehavi | ....................... 714/784 |

FOREIGN PATENT DOCUMENTS

| | | | |
|---|---|---|---|
| EP | 0 278 383 A2 | 8/1988 | |
| EP | 0278383 A | * 8/1988 | .......... H03M/13/00 |

OTHER PUBLICATIONS

Alexander Bogomolny, Addition of Vectors and Matrices, Copyright© 1996–2003, published at http://www.cut-the-knot.org/do_you_know/add_vec.shtml, pp 1–3.*

American Heritage Dictionary of the English Language, Fourth Edition, © 2000, entries for "array" and "vector".*

"Decodeur de Berlekamp–Massey", Etude D'Un Code Correcteur D'Erreurs pour un Systeme de Telemesure, XX, XX, Jun. 1994, XP002163578, pp. 40–48. (French language).

* cited by examiner

Primary Examiner—R. Stephen Dildine
(74) Attorney, Agent, or Firm—Morrison & Foerster LLP

(57) ABSTRACT

A method of determining error values including loading an error correction code (ECC) entity having rows representing data symbols, determining an error location for a first row, generating an error syndrome for the first row, determining an erasure constant array from the error location, determining an error location for each of the remaining rows, generating an error syndrome for each of the remaining rows and determining the error values for each of the rows from the corresponding error location and corresponding error syndrome and the constant.

9 Claims, 4 Drawing Sheets

ERASURE CORRECTION FOR ECC ENTITIES

BACKGROUND

This invention relates to error detection and correction of stored data in general and more particularly to the correction of long burst errors or missing data, also known as erasure correction.

The use of increasingly higher density storage media in digital computer systems has caused an increase in the potential for defect-related data errors. To reduce data loss as a result of such data corruption, error correction codes are employed to correct the erroneous data.

Before a string of data symbols is recorded on magnetic tape, it is mathematically encoded to form redundancy symbols. The redundancy symbols are then appended to the data string to form code words, data symbols plus redundancy symbols. The code words are stored on magnetic tape. When the stored data is to be accessed from the magnetic tape, the code words containing the data symbols are retrieved from the tape and mathematically decoded. During decoding, any errors in the data are detected and, if possible, corrected through manipulation of the redundancy symbols.

Stored digital data can contain multiple independent errors. A type of error correction code used for the correction of multiple errors is a Reed-Solomon (RS) code. To correct multiple errors as strings of data symbols, RS codes utilize various mathematical properties of sets of symbols known as Galois Fields, represented by $GF(P^{**}Q)$, where "P" is a prime number and "Q" represents the number of digits, base P, in each element or symbol in the field. "P" usually has the value of 2 in digital computer applications and, "Q" is the number of bits in each symbol.

Data is typically stored on a magnetic tape in a long sequence of symbols. Errors in data stored on magnetic tape often occur in long bursts, that is many erroneous symbols in sequence. Special error detection and/or correction techniques are typically employed to handle these long burst errors.

Once a long burst error is detected the erroneous symbols involved are corrected, if possible. The faster the errors can be corrected the faster the data can be made available to a user. Thus, the effective data transfer rate increases as the speed of error correction increases.

SUMMARY

In an aspect the invention features, a method of erasure correction for an error correction code (ECC) entity including receiving an erasure location, generating a syndrome polynomial, computing an erasure constant array and correcting a first row ECC data value from the syndrome polynomial and the erasure constant array.

Embodiments of the invention may have one or more of the following advantages.

The invention relates to a class of ECC codes in which the data is encoded twice, once in the vertical dimension (column) and once in the horizontal dimension (row).

Data is generally written to a medium, such as magnetic tape, in blocks. A block is a linear address space containing typically four thousand (4 k) bytes. Thus, each block may contain up to four thousand alphanumeric characters, one alphanumeric character per byte. Each block terminates with the addition of redundancy bytes that are used as a data checker and/or correction. These redundancy bytes are referred to as column redundancy bytes. For example, the contents of the last eight bytes of a block may be generated in a linear shift feedback mechanism of all previous data written within the block. This produces a checksum or cyclical redundancy check (CRC) code for all data written into the block.

For each sixteen blocks of data, a row error correction code (ECC) entity is generated and used to correct errors that are identified by the column redundancy code. An ECC entity typically includes four blocks, each block containing 4 k bytes. Each block in the ECC entity is referred to as a column. Each column contains 4 k bytes, with each byte representing a symbol in the row code. Each row in the ECC entity represents a code word (or ECC data symbol) that is a mathematical representation of the data contained in one of the sixteen previous blocks of data. Each row of the ECC entity terminates in an error correction code known as an ECC row redundancy code. The ECC row redundancy code provides a method of recovering data symbol errors contained within the rows of the ECC entity.

During a read operation, data is read from the sixteen blocks of data along with their associated row ECC data symbols which are contained in the ECC entity. An entire column (block) of data symbols in an ECC entity will be erased if the system determines that there are un-correctable errors in the column. The error has occurred in a known location with respect to the row code. To correct the erasure, an error locator polynomial is generated, a syndrome polynomial is generated, and the polynomials are seeded to determine the error value (i.e., the correct data), for each of the four thousand rows of symbols in the ECC entity.

The fact that the erasure locations are identical for every row in an ECC entity is used to pre-compute a constant array. This constant array depends only on the erasure locations so that the constant array may be shared by every row in the ECC entity and calculated only once. For each row, a syndrome polynomial is generated. Using the syndrome polynomial in combination with the pre-computed constant array generates the row error value without the need of generating the same constant array from the error locator polynomial and syndrome polynomial for each row in the ECC entity.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The foregoing features and other aspects of the invention will be described further in detail by the accompanying drawings, in which.

Like reference symbols in the various drawings indicate like elements.

DETAILED DESCRIPTION

Figure 1:
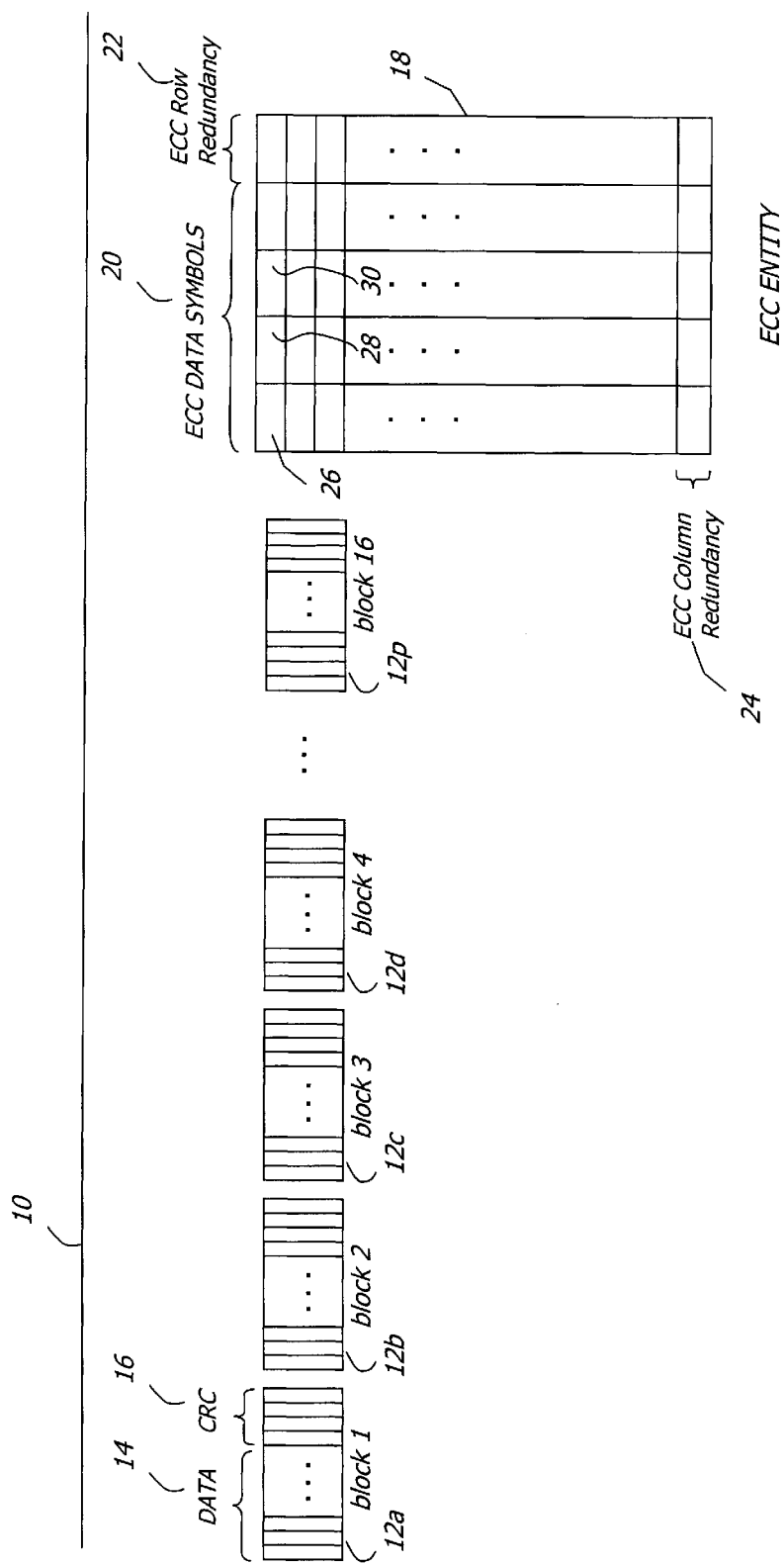
FIG. 1 is a block diagram of sixteen blocks of data with an associated ECC entity.

Referring to FIG. 1, data is written to a medium 10, such as magnetic tape, as follows. Data is placed in one of N data blocks 12a–12p. Each block, block 12a for example, contains four thousand (4 k) bytes of data 14 followed by a number of ECC redundancy bytes 16. The data bytes 14 and ECC redundancy bytes 16 form an ECC codeword capable of detecting and correcting a number of data bytes in error per block 12a–12p. The amount of error detection and correction per block is a function of the type of ECC code chosen. An ECC entity 18 includes sixty-four data blocks, with each block being represented as a data symbol column 20 in the ECC entity 18. The ECC entity 18 also includes sixty-four data blocks, with each block being represented as a data symbol column 20 in the ECC entity 18. The ECC entity 18 also includes sixteen blocks of Row ECC symbols 22. Each row in the ECC entity 18 is an ECC codeword with 64 data symbols and 16 symbols of ECC redundancy. The sixteen Row ECC blocks 22 are also written to the medium 10. Each of the Row ECC blocks 22, when written to the medium 10, are followed by ECC redundancy bytes in the column dimension, the same as data blocks 12a–12p.

ECC row redundancy symbols 22 are generated using an encoder, which uses as input, the ECC data symbols 20 as follows. An ECC data symbol 26 located in row 1, column 1, of the ECC entity 18 represents a first ECC data symbol of a Row ECC codeword and is input to the encoder. An ECC data symbol 28 located in row 1, column 2, of the ECC entity 18 represents a second ECC data symbol of the Row ECC codeword and is input to the encoder. Each of the remaining ECC data symbols 20 is encoded in like manner, for example, an ECC data symbol 30 located in row 1, column 3, of the ECC entity 18 represents a third ECC data symbol input to the encoder. This encoding process continues, until all sixty-four data symbols from the first row of all sixty-four data blocks have been input to the Row ECC Encoder. The Row ECC encoder generates sixteen ECC Row redundancy symbols 22 with each redundant symbol defining an ECC block or column. This process is repeated for all rows until the entire ECC entity 18 is populated with ECC data symbols 20 and Row redundancy symbols 22. Once the ECC entity 18 has been generated the data blocks are written to the medium 10, each data block corresponding to a column in the ECC entity 18. As each column is written to the medium 10, ECC column redundancy 24 is appended to the column data to allow error detection and correction in the column dimension.

During a read operation, if a system determines an error in one or more of the data blocks 12a–12p, the Column ECC code 24 of the respective data block is initially used to correct the error. If the system fails to correct the errors, the block is declared to be "erased." An erasure is an error with a known location.

If a block is declared uncorrectable by the Column ECC code 24, then all blocks that are part of the same ECC entity 18 are used to correct the block in error by utilizing the Row ECC code 22. The Row ECC code 22 is capable of correcting erased symbols up to the amount of the number of ECC redundancy symbols, sixteen, for example. Correction is accomplished using an erasure correction process (described below) based upon the properties of linear equations over Galois Fields.

Figure 2:
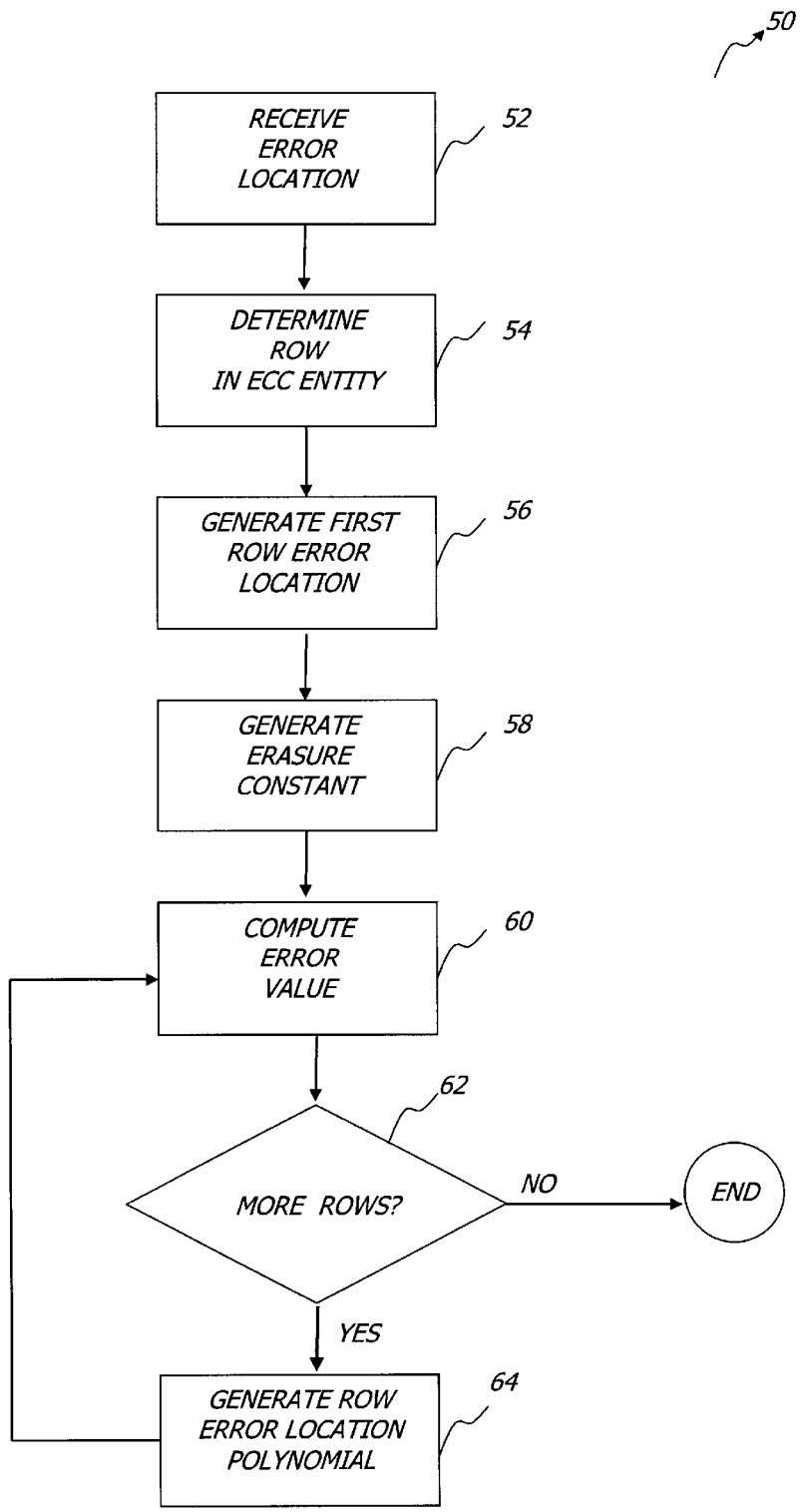
FIG. 2 is a flow diagram of an erasure correction process used in conjunction with the blocks of FIG. 1.

Referring to FIG. 2, an erasure correction process 50 includes identifying 52 the columns in error, and thus determining which symbols of the row code require correction. For the row codeword needing correction, the process 50 determines 54 an error location polynomial and generates 56 an erasure constant array. Using the error location polynomial and erasure constant array, the process 50 computes 58 the error values for each symbol in error and corrects 60 the symbols in error by XORing (exclusive or) the error value with the data symbol originally retrieved from the medium. The process 50 determines 62 whether there are remaining rows in the ECC entity to be processed. For each remaining row in the ECC entity, the process 50 computes 58 and generates 60 the error values for each erased symbol using the erasure constant array. The process 50 ends at 80.

The generation of the erasure constant array will now be described in conjunction with an ECC entity.

Figure 3:
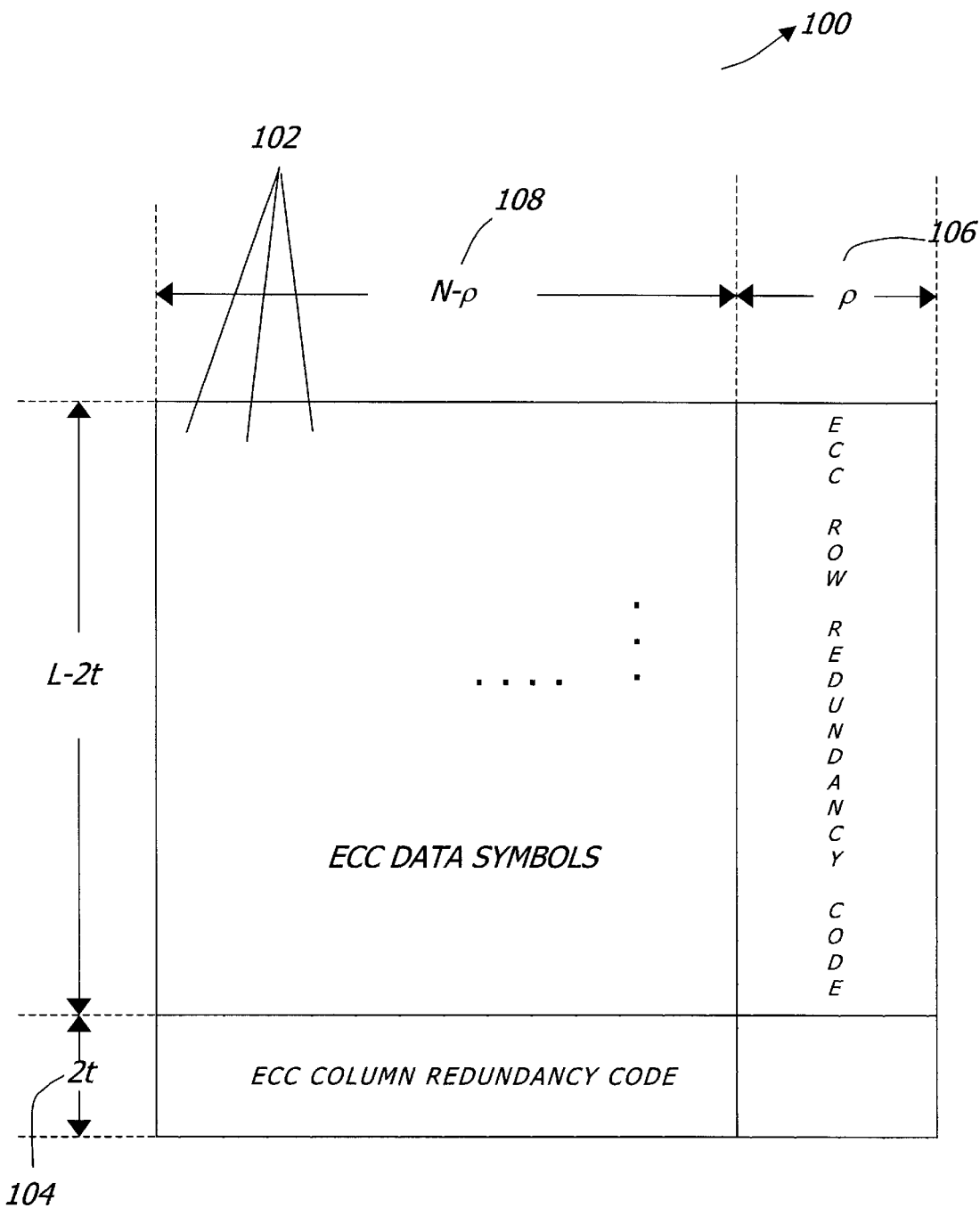
FIG. 3 is a block diagram of an ECC entity.

Referring to FIG. 3, a correction code (ECC) entity 100 includes N columns 102 of length L m-bit symbols. In each column there are 2t+e ECC column redundancy codes 104. A decoder will correct up to t errors per column. For row correction there are $\rho$ ECC row redundancy symbols 106 and N–$\rho$ ECC data symbols 108. The p ECC row redundancy symbols 106 are designed to correct up to p erasures per row.

In an embodiment, an (L, L–2t–e) m-bit symbol RS code is used for the columns, and a (N, N–$\rho$) m-bit symbol RS code is used for the rows. When one of the columns fails to be corrected and is declared to have errors, this column will be erased, i.e., considered to have all errors. Thus, every row in the ECC entity 100 shares the same erasure locations. The error correction process 50 (of FIG. 2) uses this property to correct the erasures for the entire ECC entity 100.

For the ECC entity 100 there is L row erasure corrections. In every row, the code is m-bit (N, N–$\rho$) RS code with a generator polynomial $g(x)=(x-1)(x-\alpha)\ldots(x-\alpha^{\rho-1})$ and a syndrome polynomial represented as $S(X)=S_0+S_1X+\ldots+S_{\rho-1}X^{\rho-1}$.

For a given N symbol data $r_0, r_1, \ldots, r_{N-1}$, the syndromes are $$S_k = \sum_{i=0}^{N-1} r_i \alpha^{ik}$$

where $k=0, 1, \ldots, \rho-1$. Given $(r_0, r_1, \ldots, r_{N-1})=(c_0, \ldots, C_{N-1})+(e_0, \ldots, e_{N-1})$, such that $(c_0, \ldots, C_{N-1})$ is a row of codewords and $(e_0, \ldots, e_{N-1})$ is the error vector, the syndromes are also given by $$S_k = \sum_{i=0}^{N-1} e_i \alpha^{ik}.$$

In an embodiment, it is assumed the all $\rho$ syndromes have been calculated.

If there are $\rho$ erasures $i_0, \ldots, i_{\rho-1}$, and $X_j=\alpha^i{}_j$ is denoted, then an error-location polynomial is defined by $$\sigma(x) = \sum_{i=0}^{\rho} \sigma_i x^i = (x+X_0)(x+X_1)\ldots(x+X_{\rho-1}).$$

Moreover, the polynomial associated with the jth erasure position is defined as $$\sigma^{(j)}(x) = \prod_{i \neq j} (x+X_i) = \sum_{i=0}^{\rho-1} \sigma_{ji} x^i$$

By the above equation and the property of $$S_k = \sum_{i=0}^{\rho-1} Y_i X_i^k,$$

where $Y_i$ is an error value, and $X_i^k$ is an error (known) location then $$\sum_{k=0}^{\rho-1} \sigma_{jk} S_k = \sum_{k=0}^{\rho-1} \sigma_{jk} \sum_{i=0}^{\rho-1} Y_i X_i^k = \sum_{i=0}^{\rho-1} Y_i \left( \sum_{k=0}^{\rho-1} \sigma_{jk} X_i^k \right) = \sum_{i=0}^{\rho-1} Y_i \prod_{k \neq j} (X_i + X_k)$$

combining this conclusion with $$\sigma^{(j)}(x) = \prod_{i \neq j}(x + X_i) = \sum_{i=0}^{\rho-1} \sigma_{ji} x^i,$$

the following results:

Error value: $Y_j = \dfrac{\sum_{k=0}^{\rho-1} \sigma_{jk} S_k}{\prod_{i \neq j}(X_j + X_i)}$ Defining $U_{jk} = \sigma_{jk} / \prod_{i \neq j}(X_j + X_i)$ for $j = 0, \ldots, \rho-1$ and $k = 0, \ldots, \rho-1$, then the previous equation becomes $$Y_j = \sum_{k=0}^{\rho-1} U_{jk} S_k.$$

The values $U_{jk}$ for each row do not depend on the row syndrome value $S_k$ (or the row error value), such values only need be computed once and the same values $U_{jk}$ are employed for every row. Thus, computations for $X_j$, $[(x), [_{ji},$ and $U_{jk}$ only need be determined once.

After the column correction, erasure position i will be given to the erasure decoder. However, to find the error values, one needs to know $\alpha^i_j$ which corresponds to $X_j$, $j=0, \ldots, \rho-1$. To this end, two embodiments may be used.

An embodiment uses a look up table that maps i to $\alpha^1$. The table size is N×m bits.

Another embodiment lets $p = \lfloor \log N \rfloor$ with base 2. $p+1$ values $\beta_j = \alpha^{2^j}$, $j=0,1, \ldots, p$ are stored, and $\alpha^1$ directly computed from i as follows. The integer i is in the range 0 to N−1 and can be represented by i and $i_o + 2i_1 + 2^2 i_2 + \ldots + 2^p i_p$ where $i_j \in \{0,1\}$ or all possible j. Thus, i may be represented by $p+1$ binary bits, i.e. $i = (i_0, i_1 \ldots, i_p)$. Then $$\alpha^1 = \prod_{i_j \neq 0} \beta_j.$$

By way of example, an ECC entity having N=80 produces p=6. Since $$\sum_{j=0}^{6} 2^j = 127,$$

there are at most six non-zeros in the representation of i. For $\rho$ erasure positions, the total number of cycles needed to compute the field value $\alpha^i$ is at most $6\rho$.

To compute $\sigma(x)$, if there are $\rho$ erasure locations $i_0, \ldots, i_{\rho-1}$ with their field values $X_k = \alpha^{i_k}, k=0,1, \ldots, \rho-1$, then according to $$\sigma(x) = \sum_{i=0}^{\rho-1} \sigma_i x^i = (x + X_0)(x + X_1) \ldots (x + X_{\rho-1}),$$

$\sigma(x)$ may be obtained.

$\sigma_{ji}$ may be obtained recursively from $\sigma_i$ and $X_j$.

$$(x + X_j)\sigma^{(j)}(x) = (x + X_j)\left[ \sum_{i=0}^{\rho-1} \sigma_{ji} x^i \right] = \sigma(x) = \sum_{i=0}^{\rho} \sigma_i x^i$$

and, $$(x + X_j)\left( \sum_{i=0}^{\rho-1} \sigma_{ji} x^i \right) =$$

$$\sum_{i=1}^{\rho} \sigma_{j(i-1)} x^i + \sum_{i=0}^{\rho-1} \sigma_{ji} X_j x^i = \sigma_{j0} X_j + \sum_{i=1}^{\rho-1} (\sigma_{j(i-1)} + \sigma_{ji} X_j) x^i + \sigma_{j(\rho-1)} x^\rho$$

Compare $$\sigma_{j0} X_j + \sum_{i=1}^{\rho-1}(\sigma_{j(i-1)} + \sigma_{ji} X_j)x^i + \sigma_{j(\rho-1)} X^\rho \text{ with } \sum_{i=0}^{\rho} \sigma_i X, \text{ for } i = 1, \ldots,$$

$\rho-1$. By the definition of $\sigma^{(j)}(x)\sigma_{j(\rho-1)} = 1$. Thus, $[_{j0} X_j = [_0$, and $\sigma_{j(i-1)} = \sigma_{ji} X_j + \sigma_i$, and the rest of $\sigma_{ji}$ may be recursively computed.

In order to compute $U_{jk}$, let $V_{il} = X_i + X_i$ for i, j∈{0, \ldots, \rho-1} but i does not equal j. Then, for every erasure location $$i_j, \quad W_j = \prod_{i \neq j} V_{ij}$$

is determined. Lastly $U_{jk} = \sigma_{jk}/W_j$ for any two integers $j=0, \ldots, \rho-1$ and $k=0, \ldots, \rho-1$ is determined.

Figure 4:
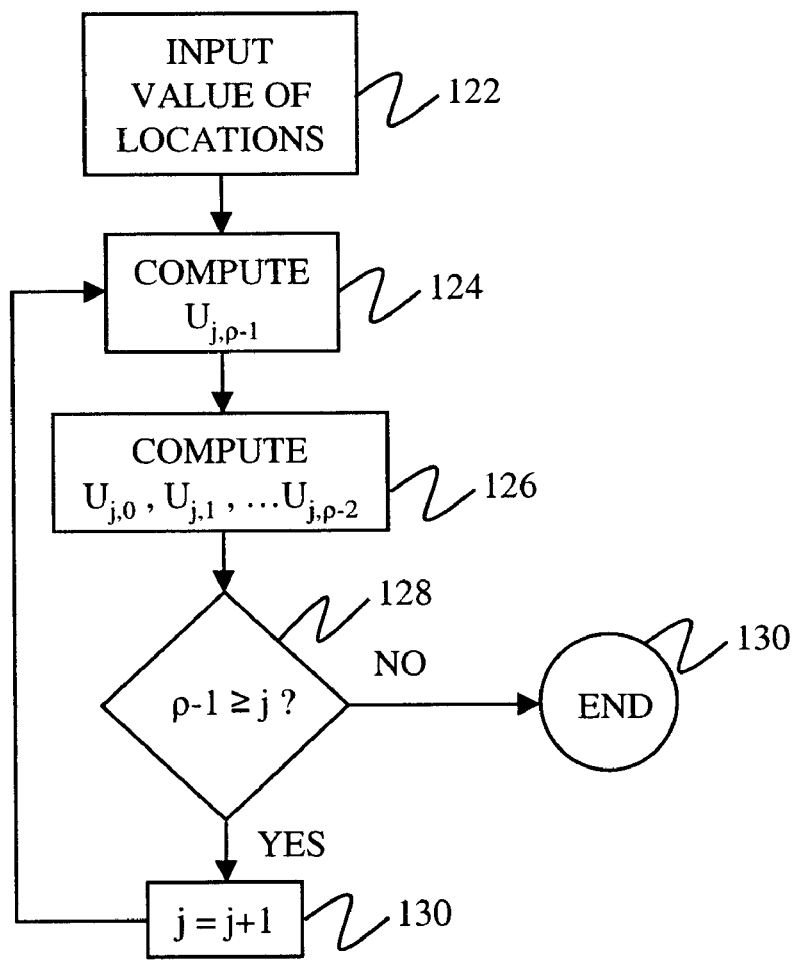
FIG. 4 is a flow diagram of a process used to compute an ECC erasure constant.

Referring to FIG. 4, a process 120 to generate an erasure constant $U_{jk}$ includes inputting 122 the value of locations $X_0, X_2, \ldots, X_{\rho-1}$, the coefficients of error-locator polynomial $\sigma_0, \sigma_1, \ldots, \sigma_\rho$ and initializing j=0. $U_{j,\rho-1}$ is computed 124. $U_{j,0}, U_{j,1}, \ldots U_{J,\rho-2}$ are computed 126. The process 120 determines 128 whether $(p-1) \geq j$, if not the process 120 ends 130. If $(\rho-1) \geq j$, j is incremented 132 and the process 120 continues to generate 124 $U_{j,\rho-1}$.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A computer-implemented method of erasure correction for an error correction code (ECC) entity, comprising:
   receiving an erasure location;
   generating a syndrome polynomial;
   computing an erasure constant array; and
   correcting a first row ECC data value from the syndrome polynomial and the erasure constant array.

2. The computer-implemented method of claim 1 wherein the computing the erasure constant array comprises:
   receiving a second erasure location; and
   correcting the second erasure location from a second syndrome polynomial and the erasure constant array.

3. A computer-implemented method of correcting a row error correction code (ECC) data value for an ECC entity, comprising:
   receiving an erasure location;
   determining the row ECC data value by the algorithm:

$$Y_j = \sum_{k=0}^{\rho-1} U_{jk} S_k$$

where $Y_j$ is the error value for the row j, is an erasure number, $U_{jk}$ is an erasure constant array and $S_k$ is a row j error syndrome.

4. The computer-implemented method of claim 3 wherein the error constant $U_{jk}$ comprises:
   inputting values of locations;
   inputting coefficients of the error location polynomial;
   initializing j=0; and
   computing $U_{j0}$ though $U_{j\rho-1}$.

5. The computer-implemented method of claim 3 wherein Ujk comprises:

$$U_{jk} = \sigma_{jk} \bigg/ \prod_{i \neq j}(X_j + X_i).$$

6. A method of determining error values, comprising:
   loading an error correction code (ECC) entity having rows representing data symbols;
   determining an error location for a first row;
   generating an error syndrome for the first row;
   determining an erasure constant array from the error location;
   generating an error syndrome for each of the remaining rows; and
   determining the error values for each of the rows from the corresponding error location and corresponding error syndrome and the constant.

7. An error correction method comprising:
   loading an error correction entity from a digital linear tape;
   generating an erasure constant array;
   determining error values for error locations using an error syndrome and the erasure constant array.

8. The method of claim 7 wherein the error correction entity comprises rows representing data symbols.

9. The method of claim 7 wherein generating the erasure constant array comprises:
   determining an error location for a first row in the error correction entity; and
   generating an error syndrome for the first row.

* * * * *